(12) United States Patent
Mallery et al.

(10) Patent No.: US 6,746,318 B2
(45) Date of Patent: Jun. 8, 2004

(54) WORKPIECE CARRIER WITH ADJUSTABLE PRESSURE ZONES AND BARRIERS

(75) Inventors: Daniel S. Mallery, Aloha, OR (US); Sean S. Logan, Portland, OR (US); James F. Lee, Chandler, AZ (US)

(73) Assignee: Speedfam-IPEC Corporation, Chandler, AZ (US)

( * ) Notice: Subject to any disclaimer, the term of this patent is extended or adjusted under 35 U.S.C. 154(b) by 107 days.

(21) Appl. No.: 09/975,450

(22) Filed: Oct. 11, 2001

(65) Prior Publication Data

US 2003/0073381 A1 Apr. 17, 2003

(51) Int. Cl.[7] ................................. B24B 5/00
(52) U.S. Cl. ....................... 451/285; 451/287; 451/388; 451/398; 451/402
(58) Field of Search ................. 451/41, 285–289, 451/388, 390, 398, 402

(56) References Cited

U.S. PATENT DOCUMENTS

| | | | |
|---|---|---|---|
| 3,809,050 A | 5/1974 | Chough et al. ............... 125/35 |
| 4,183,545 A | 1/1980 | Daly ............................. 279/3 |
| 4,693,036 A | 9/1987 | Mori ......................... 51/131.3 |
| 5,216,843 A | 6/1993 | Breivogel et al. ......... 51/131.1 |
| 5,423,716 A | 6/1995 | Strasbaugh |
| 5,718,620 A | 2/1998 | Tanaka et al. .............. 451/288 |
| 5,762,539 A | 6/1998 | Nakashiba et al. ............ 451/41 |
| 5,916,012 A | 6/1999 | Pant et al. ...................... 451/41 |
| 6,056,632 A | 5/2000 | Mitchel et al. ............... 451/288 |
| 6,102,786 A | 8/2000 | Hirose et al. ................ 451/287 |
| 6,110,025 A | 8/2000 | Williams et al. ............ 451/286 |
| 6,116,991 A | 9/2000 | Liu et al. ..................... 451/285 |
| 6,139,400 A | 10/2000 | Sato et al. ..................... 451/10 |
| 6,155,915 A | 12/2000 | Raeder ........................ 451/285 |
| 6,203,408 B1 | 3/2001 | Quek ............................ 451/41 |
| 6,358,129 B2 * | 3/2002 | Dow ........................... 451/285 |
| 6,368,189 B1 * | 4/2002 | Maloney et al. .............. 451/41 |
| 6,443,820 B2 * | 9/2002 | Kimura ...................... 451/285 |
| 6,506,105 B1 * | 1/2003 | Kajiwara et al. ........... 451/289 |

FOREIGN PATENT DOCUMENTS

| | | |
|---|---|---|
| EP | 0 859 399 A | 8/1998 |
| EP | 0 922 531 A | 6/1999 |
| EP | 1 048 406 A | 11/2000 |
| JP | 2-243263 A | 9/1990 |
| WO | WO 00 21715 A | 4/2000 |

* cited by examiner

*Primary Examiner*—M. Rachuba
(74) *Attorney, Agent, or Firm*—Ingrassia Fisher & Lorenz, P.C.

(57) ABSTRACT

A carrier with adjustable pressure zones and adjustable barriers between zones for distributing the pressure on the backside of a wafer. The pressure zones may be created using an elastic web diaphragm. One or more grooves are formed in the surface of the diaphragm to relieve vacuum formed between the diaphragm and wafer.

9 Claims, 10 Drawing Sheets

WORKPIECE CARRIER WITH ADJUSTABLE PRESSURE ZONES AND BARRIERS

BACKGROUND OF THE INVENTION

1. Field of the Invention

The present invention is directed generally to the planarizing of silicon wafers and other workpieces with an improved wafer carrier having adjustable pressure zones and adjustable pressure barriers.

2. Description of Related Art

A flat disk or "wafer" of single crystal silicon is the basic substrate material in the semiconductor industry for the manufacture of integrated circuits. Semiconductor wafers are typically created by growing an elongated cylinder or boule of single crystal silicon and then slicing individual wafers from the cylinder. The slicing causes both faces of the wafer to be extremely rough. In addition, applicant has noticed other semiconductor wafer processing steps, e.g., shallow trench isolation (STI) and copper deposition, produce predictable concentric bulges of excess material on the wafer. For example, applicant has noticed that conventional STI processes usually produce a wide peripheral ring-shaped bulge and a small central disk-shaped bulge with a narrow trough between bulges. Applicant has also noticed that conventional copper deposition processes, usually produce a narrow peripheral ring-shaped bulge and a small central disk-shaped bulge with a wide trough between bulges.

The front face of the wafer on which integrated circuitry is to be constructed must be extremely flat in order to facilitate reliable semiconductor junctions with subsequent layers of material applied to the wafer. Also, the material layers (deposited thin film layers usually made of metals for conductors or oxides for insulators) applied to the wafer while building interconnects for the integrated circuitry must also be made a uniform thickness. Planarization is the process of removing projections and other imperfections to create a flat planar surface, both locally and globally, and/or the removal of material to create a uniform thickness for a deposited thin film layer on a wafer. Semiconductor wafers are planarized or polished to achieve a smooth, flat finish before performing process steps that create integrated circuitry or interconnects on the wafer. To this end, machines have been developed to provide controlled planarization of both structured and unstructured wafers.

A conventional method of planarizing a wafer will now be discussed. The wafer is secured in a carrier that is connected to a shaft in a CMP tool. The shaft transports the carrier, and thus the wafer, to and from a load or unload station and a position adjacent a polishing pad mounted to a platen. A pressure is exerted on the back surface of the wafer by the carrier in order to press the wafer against the polishing pad, usually in the presence of slurry. The wafer and/or polishing pad may be rotated, orbited, linearly oscillated or moved in a variety of geometric or random patterns via motors connected to the shaft and/or platen.

Numerous carrier designs are known in the art for holding and distributing a pressure on the back surface of the wafer during the planarization process. Conventional carriers commonly have a hard flat pressure plate that is used to press against the back surface of the wafer that does not conform to the back surface of the wafer. As a consequence, the pressure plate is not capable of applying a uniform polish pressure across the entire area of the wafer, especially at the edge of the wafer. In an attempt to overcome this problem, the pressure plate is often covered be a soft carrier film. The purpose of the film is to transmit uniform pressure to the back surface of the wafer to aid in uniform polishing. In addition to compensating for surface irregularities between the carrier plate and the back surface of the wafer, the film deforms around and smooths over minor contamination on the wafer surface. Such contamination could produce high pressure points in the absence of such a carrier film. Unfortunately, the films are only partially effective with limited flexibility and no capability for globally adjusting once they have been applied to the pressure plate.

A common problem for conventional carriers having a hard, flat plate, is that they cannot compensate for incoming wafers that have one or more bulges. The hard flat plate is limited by the fact that it cannot adjust the pressure applied to different zones on the back surface of the wafer. It is common for some wafer processing steps to leave bulges on the wafer. Conventional carriers typically remove approximately the same amount of material across the entire front face of the wafer, thereby leaving the bulges on the wafer. Only sufficiently smooth, flat portions of the wafer surface may be effectively used for circuit deposition. Thus, the depressions limit the useful area of the semiconductor wafer.

Other conventional carriers implement means for applying more than one pressure region across the back surface of the wafer. Specifically, some conventional carriers provide a carrier housing with a plurality of concentric internal chambers that may be independently pressurized separated by barriers. By pressurizing the individual chambers in the top plate to different magnitudes, a different pressure distribution can be established across the back surface of the wafer.

However, Applicants have discovered that the pressure distribution across the back surface of the wafer for conventional carriers is not sufficiently controllable. This is due to the lack of control of the pressure caused by the barriers on the back surface of the wafer. The barriers are important in controlling the pressure on the back surface of the wafer between internal chambers. Therefore, the ability to control the applied pressure across the entire back surface of the wafer is limited, thereby restricting the ability to compensate for anticipated removal problems.

What is needed is a system for controlling the application of multiple pressure zones and the pressure from the barriers between zones across the entire back surface of a wafer during planarization.

SUMMARY OF THE INVENTION

Thus, it is an object of the present invention to provide an apparatus and method for controlling the pressure distribution on the back surface of a wafer through independently controllable concentric zones and barriers while planarizing the wafer.

In one embodiment of the present invention, a carrier is disclosed for planarizing a surface of a wafer. The carrier includes a central disk-shaped plenum, a plurality of concentric ring-shaped plenums surrounding the central plenum and a plurality of concentric barriers between neighboring plenums. The pressure distribution on the back surface of the wafer may thus be controlled by adjusting the pressure in the plenums and the pressure exerted on the barriers.

In another embodiment, a carrier is disclosed that includes a carrier housing that advantageously comprises a rigid non-corrosive material. The carrier housing is preferably cylindrically shaped with a first major surface being used to couple the carrier to a CMP tool and a second major surface with a plurality of concentric ring-shaped plenums.

An elastic web diaphragm is placed over the second major surface thereby covering the carrier plenums. A plurality of elastic ring-shaped ribs extend orthogonally from the web diaphragm opposite the ring-shaped carrier plenums. The web diaphragm and ribs may be made from a single mold, but are preferably separate pieces. The plurality of ring-shaped ribs extending from the web diaphragm thereby defines a central disk-shaped web plenum surrounded by one or more concentric ring-shaped web plenums. The web diaphragm and ribs may be held in place by clamping rings that are tightened against the carrier housing thereby trapping the web diaphragm and ribs placed between the clamping rings and carrier housing.

The carrier plenums may be pressurized by corresponding carrier fluid communication paths in fluid communication with each of the carrier plenums. The carrier plenums are used to control an urging force on the ribs to assist the ribs in sealing against the wafer or to assist in the distribution of force on the back surface of the wafer between neighboring web plenums.

The web plenums may be pressurized by corresponding web fluid communication paths in fluid communication with the central web plenum and each of the plurality of ring-shaped web plenums. The web plenums are used to control an urging force on concentric zones to assist in controlling the distribution of pressure on the back surface of the wafer. The wafer may then be supported by the ribs and the central and ring-shaped web plenums during the planarization process.

The ribs are supported by the web diaphragm on one end, while the other end (rib foot) supports the wafer. The rib foot may be flat, round or have other shapes that improve the pivoting of the foot on the wafer or the sealing of the foot against the wafer. A vacuum path may be routed through the rib to further assist in sealing the rib to the wafer. While using ribs as the barrier between neighboring web plenums is the preferred method, other barriers such as o-rings, bellows or shields may be used to prevent fluid exchange between neighboring web plenums.

The carrier preferably has a floating retaining ring connected to the carrier housing. The retaining ring surrounds the wafer during the planarization process to prevent the wafer from escaping laterally beneath the carrier when relative motion is generated between the wafer and the abrasive surface. The floating retaining ring may be attached to the carrier housing with a retaining ring diaphragm held taut over a ring-shaped recess in the periphery of the carrier housing. A retaining ring plenum is thus created between the ring-shaped recess in the carrier housing and the retaining ring diaphragm. A retaining ring fluid communication path may be placed in either the carrier housing and/or retaining ring to communicate a desired pressure onto the retaining ring. The retaining ring preloads and shapes a portion of the polishing pad prior to the wafer moving over that portion of the polishing pad. The pressure on the retaining ring may thus be used to enhance, particularly near the wafer's edge, the planarization process for the wafer.

In another embodiment, a disk-shaped wafer diaphragm is placed adjacent the feet of the ribs, thereby enclosing the web plenums. The wafer diaphragm is placed over, and is supported partially by, the ribs. To prevent leakage between the web plenums, the rib feet may be bonded to the wafer diaphragm or they may be made from a single mold. Alternatively, the rib feet may be sealed to the wafer diaphragm using the same methods as described above for sealing the rib feet to the wafer. A wafer may then be placed against the wafer diaphragm during the planarization process while the carrier plenums and/or web plenums are adjusted to control the distribution of force on the back surface of the wafer. As a further alternative, the outermost rib may be bellows molded as a single piece with the wafer diaphragm or may be bonded to the wafer diaphragm. As a further alternative, a spring ring may be placed inside the outermost web plenum against the juncture of the outermost rib and the wafer diaphragm. The compressed spring ring will try to uniformly expand radially outward and assist in maintaining a taut wafer diaphragm.

The present invention may be practiced by analyzing incoming wafers for repeating geometric patterns. Some semiconductor wafer processing steps leave predictable concentric bulges on the wafer. The number, position, width and height of the bulges from these processing steps are often substantially the same from wafer to wafer. By using a carrier with adjustable concentric pressure zones and adjustable barrier pressures between zones, the carrier may optimize a pressure distribution across the entire back surface of the wafer. The pressure distribution on the back surface of the wafer is optimized by pressing harder on zones with larger bulges during the planarization process to produce a wafer with a substantially uniform thickness.

These and other aspects of the present invention are described in full detail in the following description, claims and appended drawings.

BRIEF DESCRIPTION OF THE DRAWINGS

FIG. 1 is a cross-sectional view of a simplified carrier having adjustable concentric ribs defining adjustable pressure zones there between;

DETAILED DESCRIPTION OF THE PREFERRED EMBODIMENTS

Improved wafer carriers according to the present invention have found immediate commercial acceptance for use with a variety of CMP tools, such as the AvantGaard 676, 776 or 876 or Auriga C or CE made commercially available by SpeedFam-IPEC headquartered in Chandler, Ariz., as well as other CMP tools that are well known in the art.

A wafer carrier in a CMP tool must retain the wafer and assist in the distribution of a pressing force on the back of the wafer while the front of the wafer is planarized against an abrasive surface. The abrasive surface typically comprises a polishing pad wetted by chemically active slurry with suspended abrasive particles. The preferred polishing pad and slurry are highly dependant on the particular process and workpiece being used. Conventional CMP polishing pads and slurries are made commercially available by Rodel, Inc., from Newark, Del. for typical applications.

Figure 1:
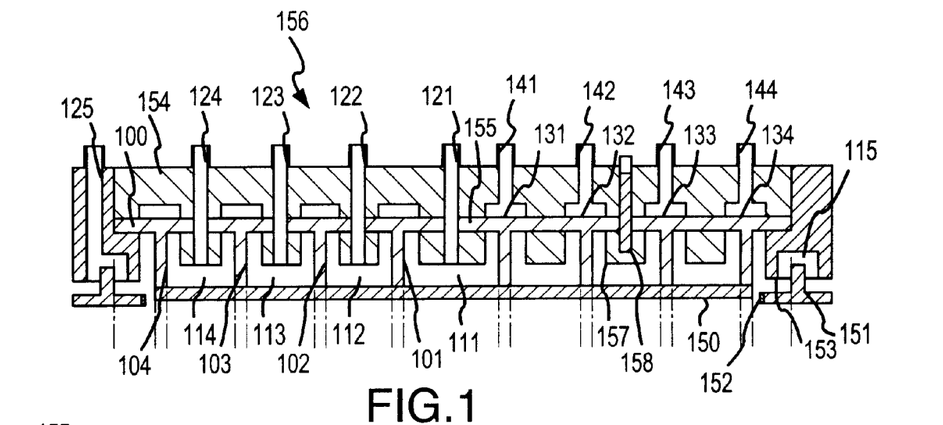
Figure 11:
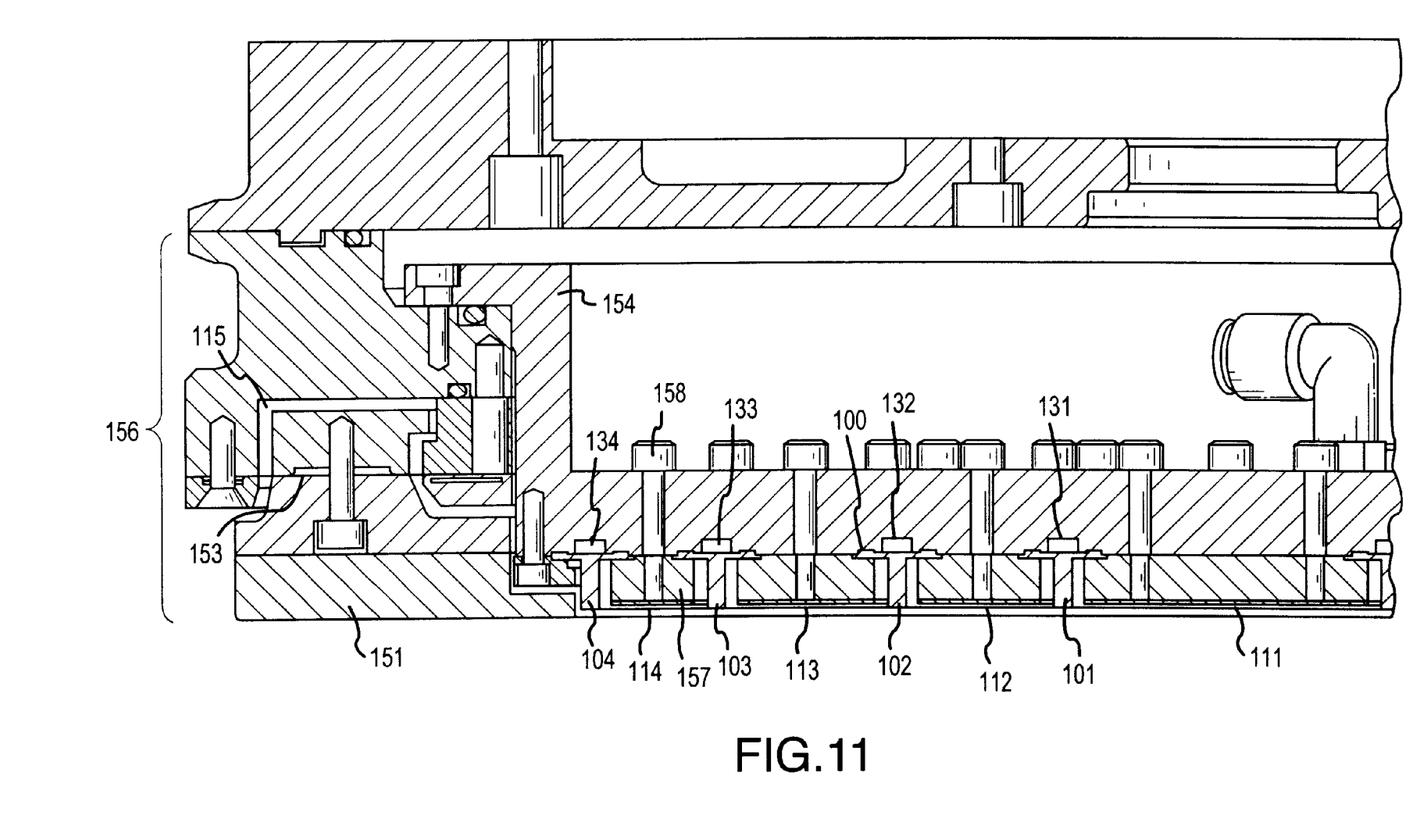
FIG. 11 is a more detailed drawing of a carrier similar to the carrier in FIG. 1.

Referring to FIGS. 1 and 11, an exemplary carrier 156 has a rigid, cylindrical carrier housing 154 providing a rigid superstructure. The carrier housing 154 may comprise, for example, stainless steel to give the carrier housing 154 the necessary rigidity and resistance to corrosion needed in a CMP environment. The top major surface of the cylindrical carrier housing 154 may be adapted to be connected to almost any conventional CMP tool. Most conventional CMP tools have a movable shaft used for transporting the carrier 156 and wafer 150. The movable shaft typically allows the carrier 156 to move between a wafer loading and/or unloading station and a position in proximity and parallel to an abrasive surface in a CMP tool.

The bottom major surface of the carrier housing 154 has a plurality of concentric ring-shaped recesses (hereinafter called carrier plenums) 131–134. For maximum control of the pressure distribution on the back surface of a wafer, at least one carrier fluid communication path 141–144 is in fluid communication with each carrier plenum 131–134. The carrier fluid communication paths 141–144 are routed through the carrier housing 154 to an apparatus for delivering an independently pressurized fluid to each carrier plenum 131–134, the purpose for which will be explained below.

A web diaphragm 100 is coupled to the carrier housing 154 across the carrier housings bottom major surface thereby sealing the carrier plenums 131–134. The web diaphragm 100 may be coupled to the carrier housing 154 with adhesives, screws, or other known techniques. However, the web diaphragm 100 is preferably kept in place by tightening a plurality of bolts 158 that pull clamp rings 157 against the carrier housing 154 thereby trapping the web diaphragm 100 placed between the carrier housing 154 and the clamp rings 157.

A plurality of concentric barriers 101–104 extends orthogonally from a major surface of the web diaphragm 100 opposite the carrier plenums 131–134. The barriers 101–104 may take the form of o-rings, bellows or other known configurations capable of separating neighboring pressure zones having a pressure differential. However, the preferred barrier is a short elastic piece of material hereafter referred to as a "rib". The head of each rib 101–104 is connected to the web diaphragm 100 while the foot of each rib 101–104 is used to support either a wafer 150 or a wafer diaphragm 300 (the wafer diaphragm 300 is discussed below with reference to FIG. 3 and FIG. 12). The ribs 101–104 are made as short as possible, preferably less than 15 mm and about 2.5 mm wide, to maximize the load capabilities and minimize deflections during the planarization process. While the web diaphragm 100 and ribs 101–104 may be manufactured as a single piece of elastic material, they are preferably separate pieces held together against the carrier housing 154 by clamping rings 157. The web diaphragm 100 and ribs 101–104 may comprise an elastic material, such as EPDM.

Figure 2:
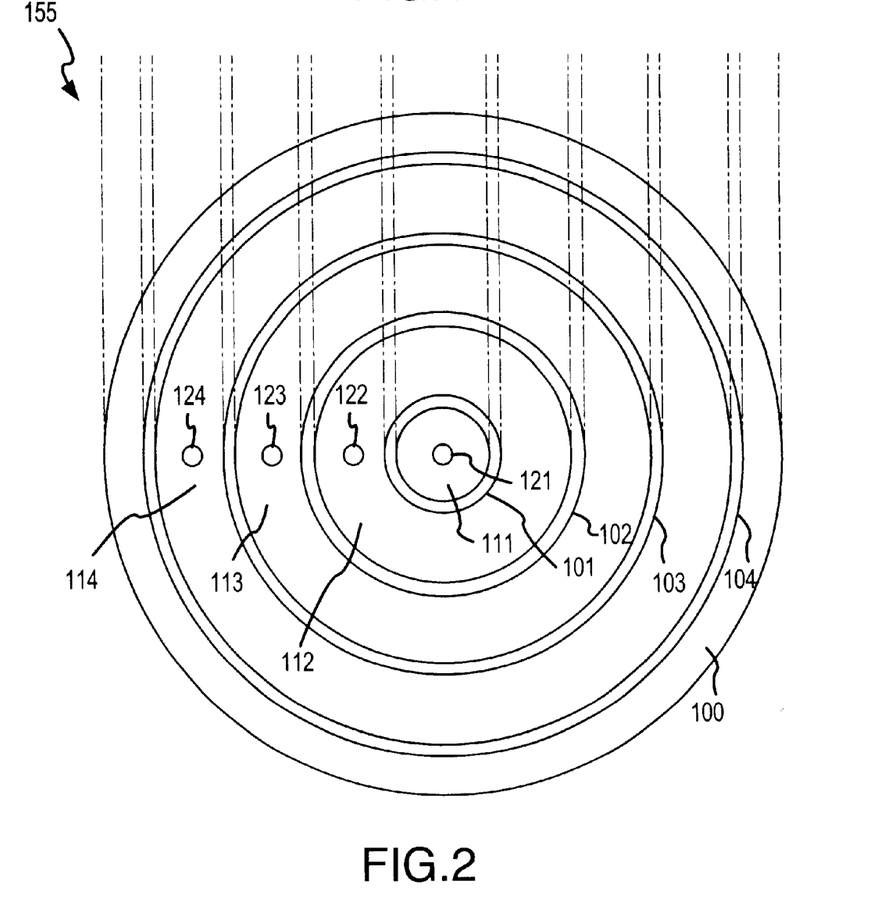
FIG. 2 is a bottom view of a web diaphragm with orthogonally attached concentric ribs defining a central disk-shaped web plenum surrounded by concentric ring-shaped web plenums.

The number of concentric barriers or ribs the web 155 has will directly correspond to the number of independently controllable pressure zones that may be created. Using FIG. 2 as an example (which is a bottom view of the web 155 in FIG. 1 and FIG. 11), four concentric ribs 101–104, are used to create a central disk-shaped web plenum 111 surrounded by three concentric ring-shaped web plenums 112–114. The central disk-shaped web plenum 111 is defined by the inner diameter of the innermost rib 111, while the surrounding web plenums 112–114 are defined by the outer diameter and inner diameter of the ribs 111–114. The spacing between the ribs 101–104 (and carrier plenums 131–134) may be adjusted to control the width of the web plenums 111–114. The position of the ribs 101–104 (in combination with the carrier plenums 131–134) may be adjusted to alter the position of the web plenums 111–114. For optimum control of the pressure distribution on the back surface of the wafer, at least one independently controllable web fluid communication path 121–124 is in fluid communication with each web plenum 111–114. The web fluid communication paths 121–124 may be routed through the carrier housing and out the center of the carrier.

With reference to FIG. 1, an example of one possible method for routing a pressurized fluid to the carrier plenums 131–34, web plenums 111–114 and retaining ring plenum 115 will now be given fir a typical CMP tool design. A compressor may be used to generate a pressurized fluid that may be fed through a manifold to one or more regulators. The pressure generated by the compressor should be higher than the pressure actually needed by any of the plenums. One independently controllable pressure regulator is preferably used for each carrier plenum 131–134, web plenum 111–114 and retaining ring plenum 115 on the carrier 156 The regulators are in fluid communication with their corresponding carrier fluid communication paths 141–144, web fluid communication paths 121–124 and retaining ring fluid communication path 125. The fluid communication paths may be routed through a rotary union on a hollow shaft, commonly found in CMP tools, connected to the carrier 156. The fluid communication paths may then be routed through the hollow shaft and carrier 156 to their respective plenums. The present invention may be practiced using a variety of compressors, manifolds, regulators, fluid communication paths, rotary unions and hollow shafts that are well known in the art.

The central disk-shaped web plenum 111 and surrounding ring-shaped web plenums 112–114 may be individually pressurized to produce a plurality of concentric constant pressure zones on the back surface of a wafer 150. The web plenums 111–114 may be made smaller, and are thus easier and quicker to pressurize, by increasing the size of the clamp rings 157. The particular pressure chosen for each pressure zone depends on the surface geometry and materials comprising the incoming wafers in combination with the other process parameters of the CMP tool. For STI or copper deposition semiconductor wafers, pressures from 1 to 10 psi, and preferably 3 to 7 psi, on conventional CMP tools may be used.

Carriers 156 with additional controllable pressure zones have zones with a smaller average width, thereby giving the carrier 156 finer control of the pressure distribution on the backside of the wafer 150. However, additional zones increase the cost of manufacturing, the cost of additional plumbing and the complexity of the carrier 156. The preferred carrier 156, therefore, uses the minimum number of web plenums 111–114 necessary for a given wafer surface geometry.

Additional structural support may be used to increase the ribs' hoop strength and minimize the deflection of the ribs 101–104. Additional structural support for the ribs 101–104 may be added with external or internal hoops being attached on the side of the ribs 101–104, external or internal structural threads attached to the ribs 101–104 or by using materials for the ribs 101–104 having a higher modulus of elasticity.

An individually controllable pressing force may be placed on the head of each rib 101–104 by pressurizing the ribs corresponding carrier plenum 131–134. The down forces generated by the carrier plenums 131–134 may be transmitted through the ribs 101–104 to the rib feet. The force on each rib 101–104 presses the rib's feet against either a wafer 150 or a wafer diaphragm 300 (discussed below with reference to FIG. 3 and FIG. 12) to create a superior seal for each web plenum 111–114. The pressure on each rib 101–104 is advantageously made equal to or greater than the pressure in the neighboring web plenums 111–114 to help prevent fluid from leaking between the neighboring web plenums 111–114. The pressurized fluid for the carrier plenums 131–134, web plenums 111–114 and retaining ring plenum 115 may be a liquid or gas and is preferably filtered air.

The rib feet may be enhanced to prevent pressurized fluid from leaking between neighboring web plenums 111–114. The shape of the rib feet will affect how well the feet seal, the pressure transmission through the rib 101–104 to the wafer 150 and how well the feet "gimbal" on the wafer 150.

Figure 5:
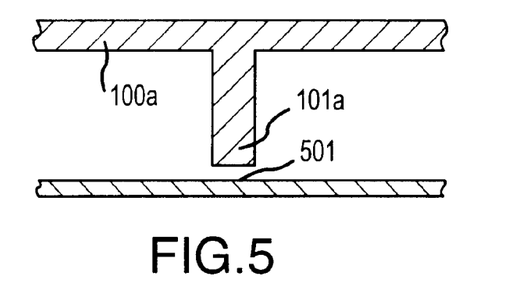
FIG. 5 is a cross-sectional view of a rib with a square foot.

Referring to FIG. 5, a cross section of a square foot 101a is shown connected to a web diaphragm 100a prior to being sealed to surface 501. The square foot 101a is easy to manufacture and provides a medium size contact area with the surface 501 to be sealed against, but has limited gimballing characteristics.

Figure 6:
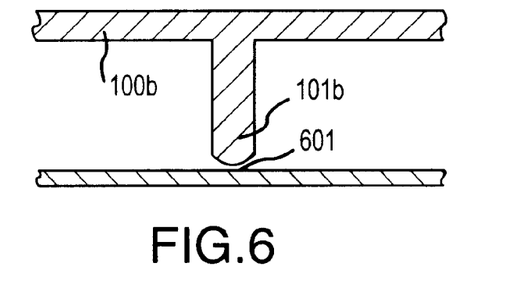
FIG. 6 is a cross-sectional view of a rib with a round foot.

Referring to FIG. 6, a cross section of a rounded foot 101b is shown connected to a web diaphragm 100b to be sealed to surface 601. The rounded foot 101b is harder to manufacture than the square foot, has minimal contact area with the surface 601 to be sealed against, but has excellent gimballing characteristics.

Figure 7:
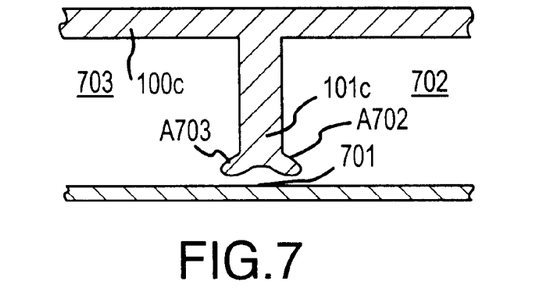
FIG. 7 is a cross-sectional view of a rib with an "elephant" or self-sealing foot.

Referring to FIG. 7, a cross section of an "elephant" foot 101c is shown connected to a web diaphragm 100c prior to being sealed to surface to surface 701. The elephant foot 101c is the most difficult to manufacture and has poor gimballing characteristics, but provides a large contact area with the surface 701 to be sealed against. In addition, pressure in the neighboring web plenums 702 and 703 may be used to press on the "elephant" foot 101c as graphically illustrated by arrows A702 and A703 to assist the "elephant" foot 101c in sealing against surface 701.

Figure 8:
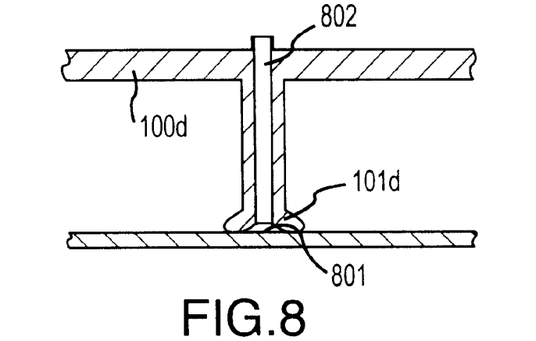
FIG. 8 is a cross-sectional view of a rib with a self-sealing foot with a vacuum assist system.

Referring to FIG. 8, a cross section of an "elephant" foot 101d is shown connected to a web diaphragm 100d prior to being sealed to a surface 801. For this rib foot 101d configuration, a vacuum line 802 is passed through to the rib foot 101d to assist in the rib foot 101d sealing against a surface 801. While the vacuum line 802 is shown in combination with the "elephant" foot design, it may also be used with other rib foot designs to improve their sealing capability.

Referring to FIG. 1 and FIG. 11, a floating retaining ring 151 is suspended from the carrier housing 154 by a retaining ring membrane 153. The retaining ring membrane 153, preferably, comprises an elastic material, such as, fairprene. The upper portion of the retaining ring 151 is enclosed in a retaining ring plenum 115 defined by the carrier housing 154 and retaining ring membrane 153. The lower portion of the retaining ring 151 extends below the retaining ring membrane 153 and makes contact with a polishing pad. A pressurized fluid may be introduced to the retaining ring plenum 115 through a retaining ring fluid communication path 125 to control the pressure the retaining ring 151 exerts on the polishing pad. The optimum pressure of the retaining ring 151 on the polishing pad will vary depending on the particular application, but for most conventional wafer process applications will typically be less than 10 psi and usually between 4 and 8 psi. The optimum pressure for the retaining ring 151 will usually be about the same pressure as that for the wafer 150 against the polishing pad.

Adjusting the pressure of the retaining ring 151 in relation to the pressure of the wafer 150 against a polishing pad may be used to control the rate of removal of material, particularly at the periphery, of the wafer 150. Specifically, a higher retaining ring 151 pressure will usually slow the rate of material removal, while a lower retaining ring 151 pressure will usually increase the rate of material removal, at the periphery of the wafer 150.

The retaining ring 151 surrounds the wafer 150 during the planarization process and prevents the wafer 150 from laterally escaping from beneath the carrier 156. The retaining ring membrane 153 allows the retaining ring 151 to adjust to variations in the polishing pad's thickness, without undesirably tilting the carrier housing 154. Because the retaining ring 151 rubs against the abrasive polishing pad, it preferably comprises a wear resistant material such as a ceramic. However, the inner diameter of the retaining ring 151 makes repeated contact with the wafer 150 and may undesirably chip the wafer 150. To prevent the wafer 150 from being chipped, a material softer than the wafer, such as, delrin, may be used to create a barrier 152 between the wafer 150 and the retaining ring 151.

Figure 3:
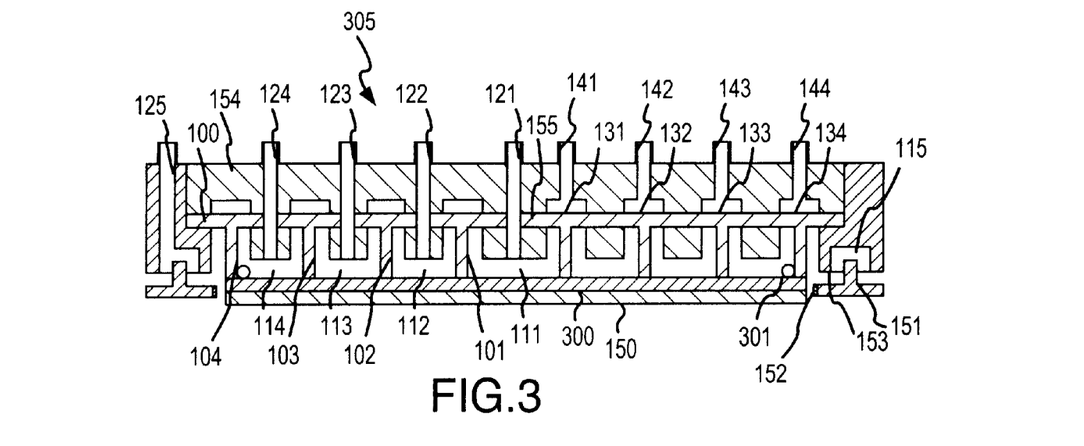
FIG. 3 is a cross-sectional view of a simplified carrier having adjustable concentric ribs defining adjustable pressure zones there between wherein the zones are enclosed by a wafer diaphragm.

With reference to FIG. 3, carrier 305 has a similar carrier housing 154, carrier plenums 131–134, carrier fluid communication paths 141–144, web diaphragm 100, ribs 101–104, rib plenums 111–114, web fluid communication paths 121–124 and floating retaining ring 151 as previously discussed. However, a wafer diaphragm 300 is positioned between the wafer 150 and the ribs 101–104 and is supported on the feet of the ribs 101–104. The ribs 101–104 may be sealed against the wafer diaphragm 300 in a manner similar to the rib feet sealing against the wafer 150 in the previous embodiment of the carrier 158. However, the ribs 101–104 are preferably bonded to the wafer diaphragm 300 to assist in preventing leakage between neighboring web plenums 111–114.

A compressed spring ring 301 may be inserted in the outermost web plenum 114 near the junction between the outermost rib 114 and the wafer diaphragm 300. The spring ring 301 is advantageously designed to expand uniformly in a radial direction to assist in maintaining a taut wafer diaphragm 300.

Figure 12:
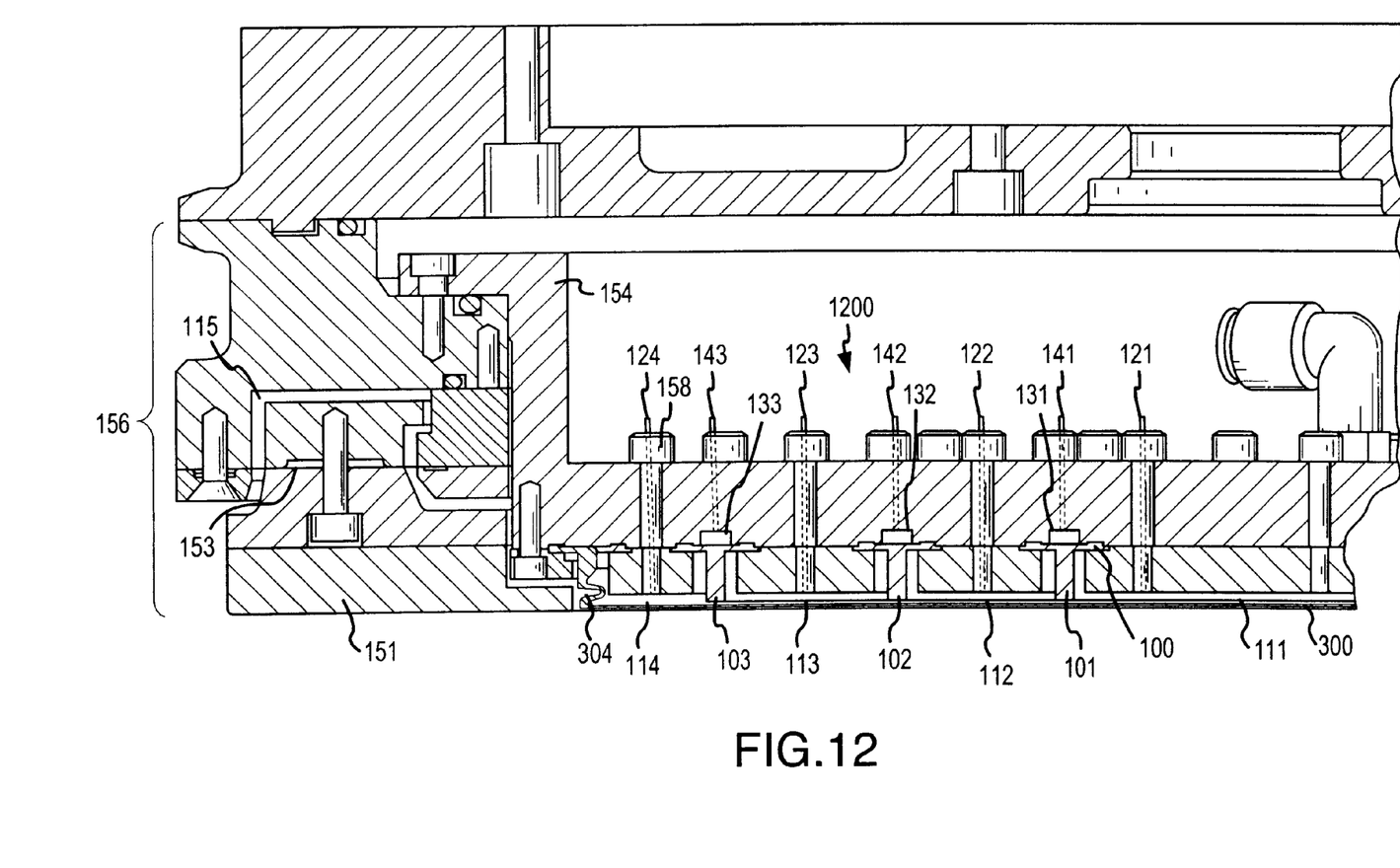
FIG. 12 is a cross-sectional view of a carrier having adjustable concentric ribs defining adjustable pressure zones wherein the zones are enclosed by a wafer diaphragm and the outermost rib is configured as a bellows.

With reference to FIG. 12, a carrier 156 has ribs 101–103, web plenums 111–114, carrier plenums 131–133, carrier fluid communication paths 141–143 and web plenum fluid communication paths 121–124, as shown in the prior embodiments. However, the outermost rib 104 shown in FIG. 3 is replaced with a bellows 304. The bellows 304 do not need a carrier plenum 134 or carrier fluid communication path 144 (both shown in FIG. 3), thereby simplifying the design and construction of the carrier 1200.

Figure 9:
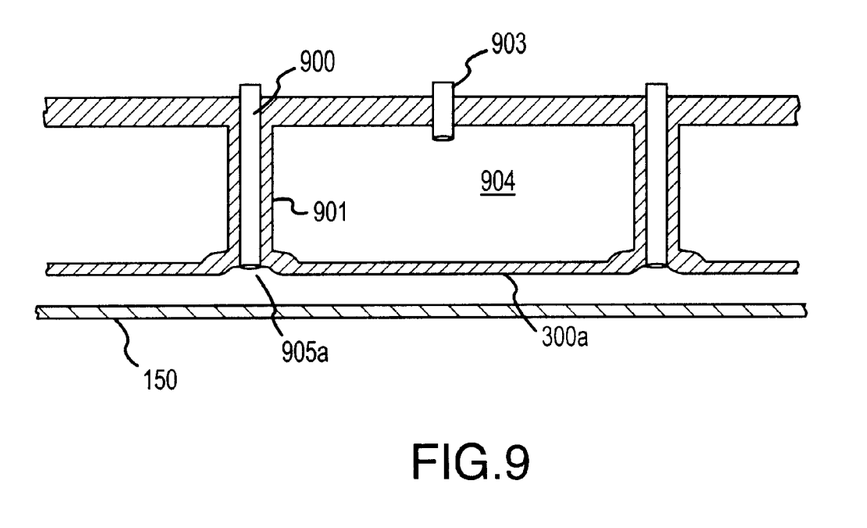
FIG. 9 is a cross-sectional view of another embodiment of the invention.

FIG. 9 illustrates a wafer diaphragm 300a attached to the rib 901, so as to seal web plenum 904. Web plenum 904 may be pressurized by web fluid communication path 903 in a manner similar to the other embodiments already discussed. This embodiment has the additional feature of a vacuum or discharge path 900 for either assisting in picking-up the wafer 150 with a vacuum or removing the wafer 150 from the carrier with a rapid discharge of fluids at point 905a.

The carriers in FIGS. 3 and 12 have the advantage of the wafer diaphragm 300 preventing the backside of the wafer 150 from being exposed to a fluid, such as air, that might dry or adhere the slurry onto the back surface of the wafer. Once slurry has dried or adhered to the wafer 150, it is extremely difficult to remove, thereby introducing contaminates that may be harmful to the wafer 150.

The carrier 156 in FIGS. 1 and 11, the carrier 305 in FIG. 3 and the carrier 1200 in FIG. 12 may be used to acquire a wafer 150 by creating one or more vacuum zones on the back surface of the wafer 150. A vacuum zone may be created by one or more of the web fluid communication paths 121–124 communicating a vacuum to one of the web plenums 111–114. The vacuum for carrier 156 in FIG. 1 and FIG. 11 is communicated directly to the back surface of the wafer 150. The vacuum for the carrier 305 in FIG. 3 or the carrier 1200 in FIG. 12 lifts the wafer diaphragm 300 from the backside of the wafer 150 creating a vacuum between the wafer diaphragm 300 and the wafer 150.

The carrier 156 in FIGS. 1 and 11, the carrier 305 in FIG. 3 and the carrier 1200 in FIG. 12 may be used to discharge a wafer 150 from the carrier. A rapid discharge of fluids through one or more of the web fluid communication paths for the carrier 156 in FIGS. 1 and 11 will directly impact the wafer 150 and blow the wafer 150 out of the carrier 156. A wafer 150 in carrier 305 in FIG. 3 or carrier 1200 in FIG. 12 may be removed from the carrier by pressurizing the web plenums 111–114 which will cause the wafer diaphragm 300 to extend outwards thereby dislodging the wafer 150 from the carrier 305.

Figure 10:
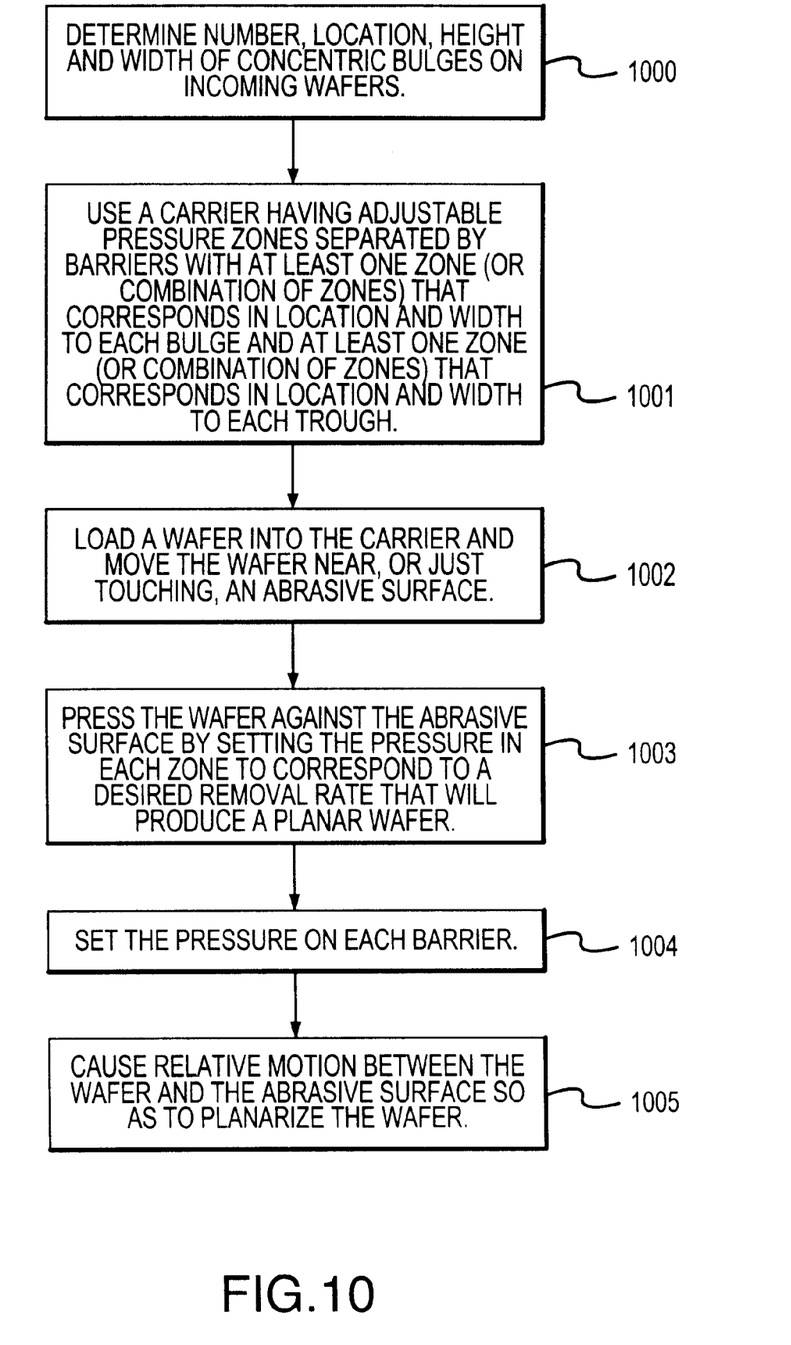
FIG. 10 is a flow chart of an exemplary process to practice the invention.

An exemplary process for using the wafer carriers begins with a determination of the number, location, height and/or width of concentric bulges on incoming wafers (step 1000). This may be done by reviewing incoming wafers prior to planarization with various known metrology instruments, such as a Model UV1050 manufactured by KLA-Tencor located in San Jose, Calif.

A carrier with adjustable concentric pressure zones that correspond to the surface geometry of the incoming wafers may be advantageously selected for use (step 1001). The carrier should have adjustable pressure zones that correspond to the ridges and adjustable pressure zones that correspond to the troughs between ridges on the wafer.

A wafer may then be loaded into the selected carrier and the carrier and wafer moved so that the wafer is parallel to and adjacent (near or just touching) an abrasive surface, such as a polishing pad (step 1002). The wafer may then be pressed against the abrasive surface by pressurizing the independently controlled pressure zones (web plenums). The pressure in each zone may be independently controlled by adjusting the pressure communicated through the zone's corresponding web fluid communication path to provide an optimum planarization process for the surface geometry of that wafer (step 1003).

Figure 4:
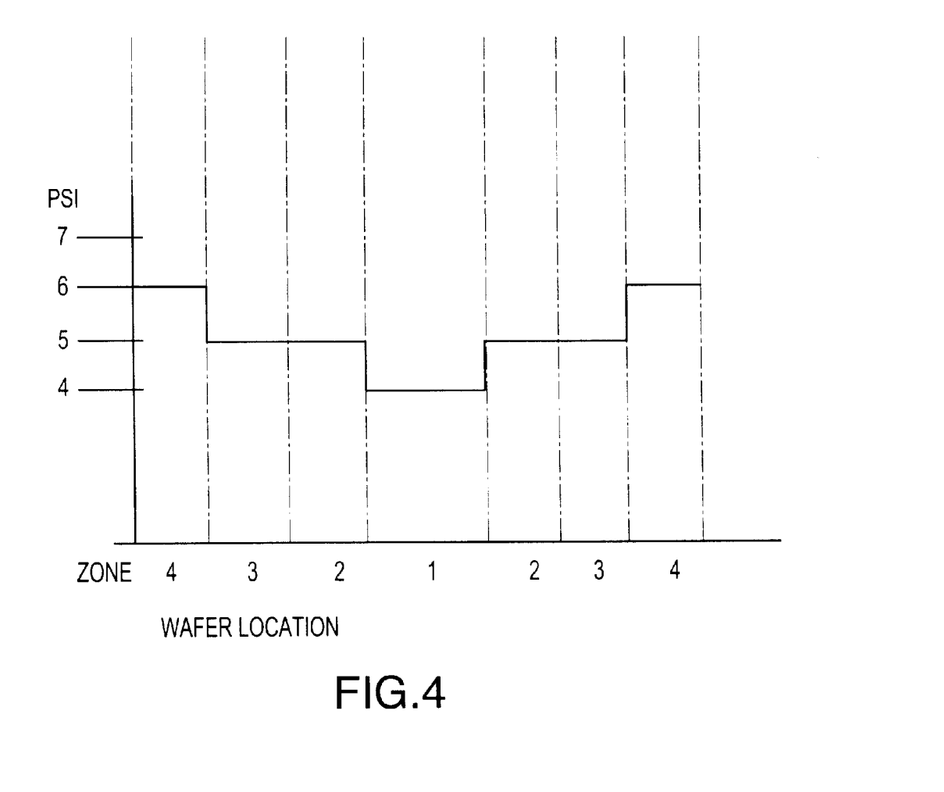
FIG. 4 is a graph relating pressure to corresponding zones on the back surface of a wafer.

FIG. 4 illustrates one possible pressure distribution on the back surface of a wafer with a central zone 1 and three surrounding zones 2–4. The central zone 1 (web plenum 111 in FIG. 3) is pressurized to 4 psi, zones 2 and 3 (web plenums 112 and 113 respectively in FIG. 3) are pressurized to 5 psi and zone 4 (web plenum 114 in FIG. 3) is pressurized to 6 psi. This distribution of pressure on the back surface of a wafer may be used for wafers with a thin bulge around the periphery and a small depression near the center of the wafer. The variation of pressures allows the carrier to press harder on zones with bulges and softer on zones with troughs or depressions during the planarization process to produce a wafer with a substantially uniform thickness. Additional zones, smaller zones or zones of varying sizes, may be used to give finer control over the distribution of pressure on the back surface of the wafer, but increase the complexity and manufacturing cost of the carrier.

In practical operations, certain semiconductor wafer processing steps leave predictable concentric bulges on the wafer surface. The bulges from these processing steps are substantially the same from wafer to wafer in that the wafers typically have the same surface geometry. For example, current copper deposition processes typically have a narrow bulge near the periphery and another bulge in the shape of a small disk near the center of the wafer. Additionally, current STI processes typically have a wide bulge near the periphery and another bulge in the shape of a small disk near the center of the wafer. A single carrier design with four roughly equal zones, as illustrated in FIGS. 1 and 3, may be advantageously used for both copper deposition and STI wafers in this situation. For a specific example, zones 1 and 4 that correspond to bulges on a copper deposition wafer may have a higher pressure, e.g., 6 psi, while the zones 2 and 3 that correspond to the trough may have a lower pressure, e.g., 5 psi. Likewise, zones 1, 3 and 4 that correspond to bulges on an STI wafer may have a higher pressure, e.g., 6 psi, while zone 2 that corresponds to a trough may have a lower pressure, e.g., 5 psi. This strategy allows one carrier design to be used to planarize wafers after two different processes.

The carrier preferably also has carrier plenums that may be individually pressurized by corresponding carrier fluid communication paths. Each pressurized carrier plenum exerts a force against the head of each rib that is transmitted through the rib to assist in pressing the feet of the rib against the back surface of the wafer (or wafer diaphragm, if one is used). This pressing force assists the feet of the ribs in making a good seal with the back surface of the wafer. The pressure in the carrier plenums may be made equal to or slightly greater (about 0.1 to 0.3 psi) than the pressure in the neighboring web plenums to assist in preventing leakage between neighboring web plenums (step 1004). Alternatively, the pressure in each carrier plenum may be set between the pressure in its neighboring web plenums to create a smoother distribution of pressure on the back surface of the wafer.

Relative motion is necessary between the wafer and the abrasive surface to remove material from the front face of the wafer thereby planarizing the front face of the wafer. The abrasive surface and/or carrier of the present invention may be rotated, orbited, linearly oscillated, moved in particular geometric patterns, dithered, moved randomly or moved in any other motion that removes material from the front face of the wafer. In addition, the abrasive surface and/or carrier may be moving relative to each other prior to, or after, the front face of the wafer contacts the abrasive surface (step 1005). However, the preferred relative motion is generated by the carrier rotating and the polishing pad orbiting. The carrier and polishing pad motion may be ramped-up to their desired speeds simultaneously with the pressure on the back surface of the wafer being ramped to its desired level.

Figure 13:
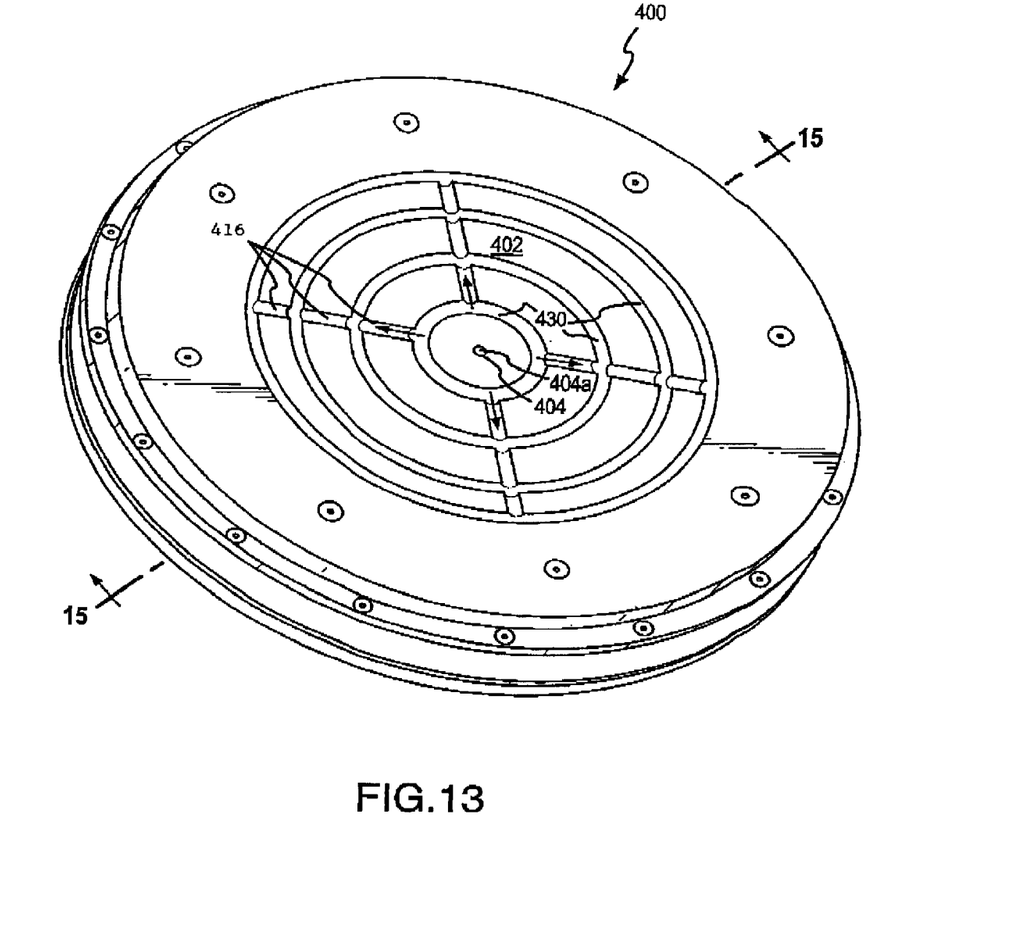
FIG. 13 is a perspective view of a carrier assembly according to principles of the present invention.
Figure 14:
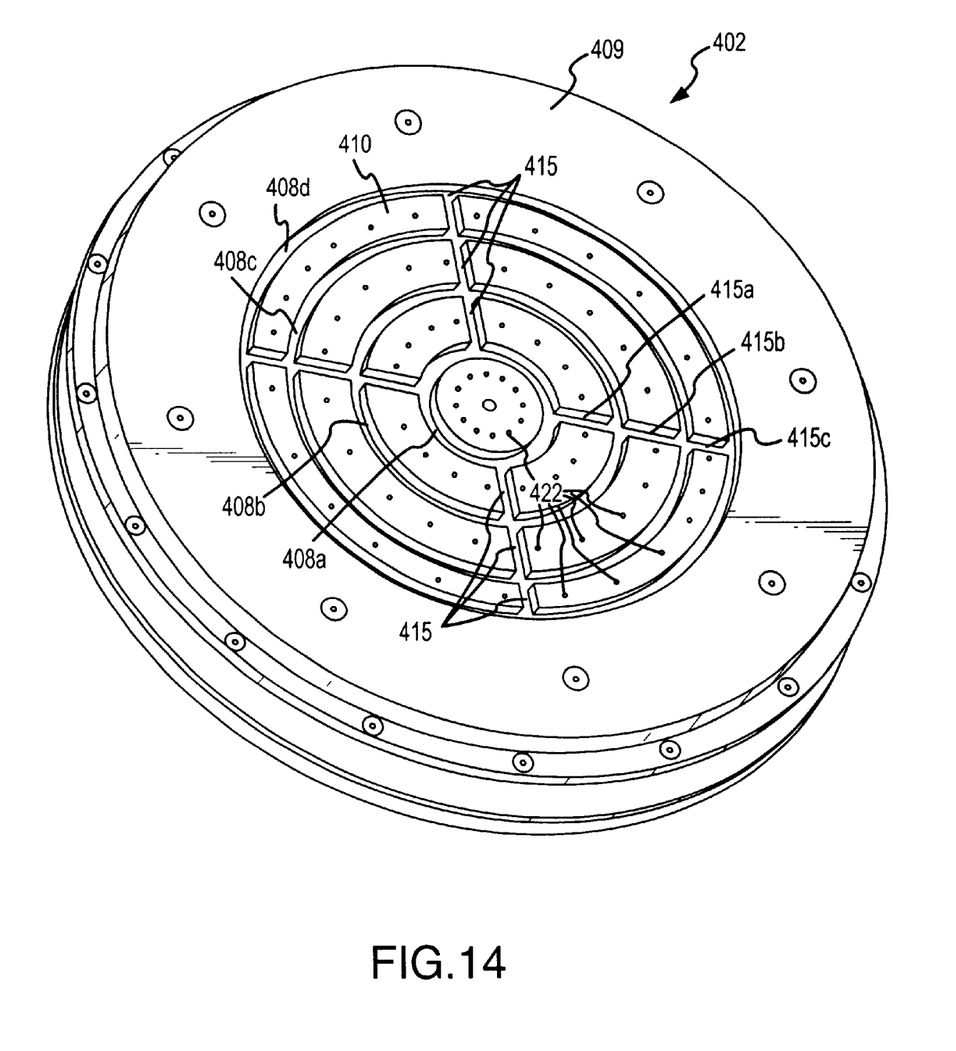
FIG. 14 shows the carrier assembly with a resilient bladder removed.
Figure 15:
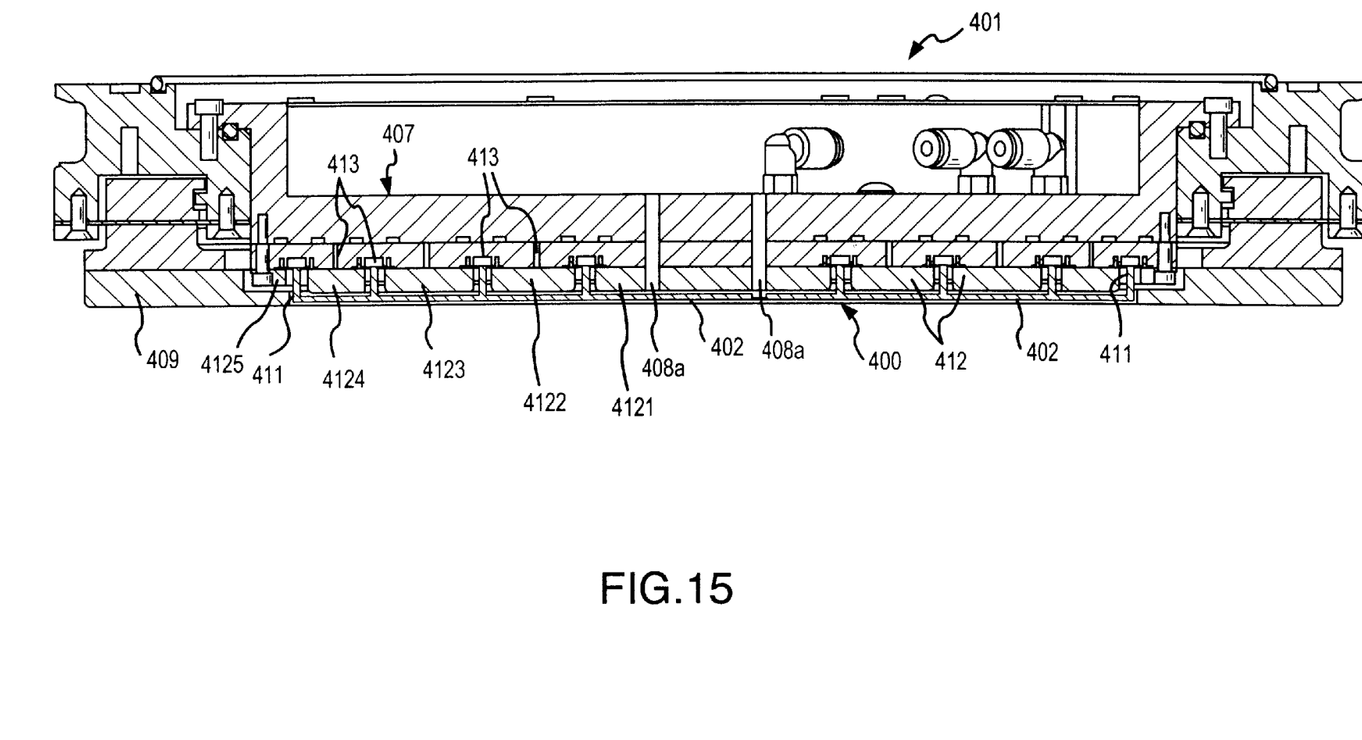
FIG. 15 is a cross-sectional view taken along the line 15—15 of FIG. 13.

Turning now to FIGS. 13–15, a carrier according to principles of the present invention is generally indicated at 400. Shown in FIG. 13 is a bladder 402 under vacuum. FIG. 14 is a carrier 400 with bladder 402 removed for illustrative purposes. FIG. 15 is a schematic illustration showing a cross section of carrier 14, with additional features of a completed carrier assembly 401, adapted for mounting to conventional polishing tools.

Carrier 400 is generally constructed and operated according to the principles set forth above, but includes additional features for improved wafer unloading.

As explained above, the resilient bladder or web may be pressurized with a positive pressure to beneficially alter a CMP polishing process. It is also possible to operate the carrier such that negative pressure forces are applied to the resilient bladder. These negative pressure forces may be used in conjunction with a CMP polishing or other production operation. For example, negative pressure forces may be applied during wafer acquisition and retention, to prepare the wafer for transport from one location to another, or to offload a wafer to a downstream process or loading station. Negative pressures may also be applied to the ribs using the techniques described above.

Under wafer retention conditions, with the bladder conforming to the concentric ring-shaped recesses or carrier plenums, the back surface of the wafer is held in close contact with a bladder surface and is securely retained, for example, for transport or transfer operations. When operated in this manner, portions of the resilient bladder are pulled away from the wafer surface when the bladder is subjected to negative pressure. Hollow enclosures are formed with sealing of the wafer to the bladder surface.

Initially, during wafer acquisition, the bladder is maintained in a relaxed or relatively flat configuration as initial contact is made with the wafer back surface. As vacuum is applied to the interior or backside of the bladder, the bladder is made to recess, conforming generally to the carrier plenums, thereby creating annular cavities facing the wafer backside surface. As vacuum continues to be applied to the bladder, the size of the annular cavity increases as the bladder is stretched to more fully conform to the carrier plenums. This in effect creates plunger or suction cup-type forces and applies localized suction forces to the wafer backside surface, which increases sealing of the wafer backside surface to those portions of the bladder corresponding to the carrier plenums. It is preferred that the bladder 402 be impermeable so as to prevent pneumatic vacuum signals applied to its backside from being communicated directly to the wafer surface contacting the bladder. As vacuum is pulled through passageways 413 and is applied to the backside of the bladder 402 via ribs 411, the bladder is resiliently deformed, being pulled away from the wafer surface. Although pockets of resilient bladder deflection could be employed, it is generally preferred that the pockets form a continuous annular recess indicating by 430 in FIG. 13. In the illustrated embodiment, three annular recesses are formed with the application of vacuum from the backside of the carrier structure. As the bladder is deformed, mechanical vacuum or suction cup forces are applied to the wafer backside held in imminent contact with the bladder. As receding of the bladder progresses, the suction cup forces are increased, which cause the wafer to adhere to the bladder.

Although, wafer acquisition and retention forces have been successfully invoked, use of certain commercially desirable bladder materials and other operating conditions have made it difficult to unload or eject a wafer on demand in a desired manner. The conformed bladder cavities form a suction cup-like structure with the wafer backside surface. These structures, as mentioned, hold mechanical vacuum increasing the seal formed between the bladder and wafer backside surface. These bladder cavity structures are annular in configuration, and continuous. These structures continue after the vacuum signal is removed from the carrier, despite the resilient properties of the bladder.

It has been found, using commercially preferred materials, especially bladder materials having the desired resilience that a mechanical vacuum developed between the bladder and wafer backside surface continues without external intervention, even after vacuum signals are removed from the carrier. The vacuum forces is applied between the receding bladder and the backside of the wafer, are referred to as "mechanical" vacuum forces, so as to be distinguished from "pneumatic" vacuum forces applied directly to the backside of the bladder. Thus, suction cup forces causing the wafer to adhere to the bladder, and hence the carrier, are associated with the formation and increase of size of the concave depressions or voids resulting from elastic deformation of the bladder.

Where a wafer experiences prolonged contact with a bladder having annular concavities, the vacuum forces between the bladder and the wafer continue virtually unabated and in certain instances increase over time. It is believed that the increase in the mechanical vacuum applied to the wafer backside surface results from the evacuation of small amounts of liquid or air between the wafer and bladder.

An arrangement is provided for wafer unloading, and includes a passageway extending to the bladder surface, for applying a fluid pressure between the bladder and backside wafer surface. Preferably, the pressure signal emerges from a central portion of the bladder, it being preferred that the pressure pathway be located at the center of the bladder, preferably at a point within the radially inner carrier plenum.

With reference to FIG. 13, in one preferred embodiment, a single pressure pathway 404a is provided (although, multiple pathways could be provided, if desired). The passageway communicates with a hole 404a in the bladder and is commonly referred to as an exit opening or single chuck below-off hole. Referring again to FIG. 14, exit opening 404a is shown in the general center of the carrier structure. The remaining holes visible in FIG. 14 receive threaded fasteners for securing the layers of the carrier structure together.

A blow-off pressure signal is initially developed within a cavity formed between bladder 402 and the wafer backside surface, within the radially inner carrier plenum 408a shown in FIG. 14. Preferably, carrier 402 includes carrier plenums 408c and an intermediate carrier plenum 408b. An annular space 408d is formed between clamping plate 409 in the outer exposed periphery of the carrier body 410.

Turning again to FIG. 14, an annular recess or space 408a is formed between first and second clamp rings 4121 and 4122 shown in FIG. 15. Similarly, another space or annular recess 408b is formed between second and third clamp rings 4122 and 4123, while a third space or recess 408c is formed between clamp rings 4123 and 4124. An outermost annular recess 408d is formed between clamp rings 4124 and 4125. Spaces 408a–b, receive bladder ribs 411, in the manner illustrated in FIG. 15.

Turning again to FIG. 14, a series of vacuum-relieving recesses, channels or grooves 415 are formed in the surface of the carrier structure. Preferably, recesses 415 cooperate with spaces 408a–408d to form a continuous recess pathway from radially outer portions of the bladder-supporting structure to the center, shown in FIG. 14. Preferably, the segments 415 are arranged in linear configurations and most preferably are arrangement in four linear configurations offset 90° from one another in the manner illustrated in FIG. 14. As shown in the right-hand portion of FIG. 14, recesses 415a, 415b and 415c are arranged along a straight line, as is preferred.

However, if desired, recess 415b could be offset from recesses 415a, 415c and a continuous recess pathway would still be formed due to the annular configurations of the spaces 408a–408d. This, however, would increase machining costs and accordingly is not preferred.

As mentioned above, the single blow-off hole and its associated fluid-communicating passageways can be employed to deliver a positive pressure signal to the backside of the wafer. This signal applies to a positive pressure force, either continuous or intermittent which is directed so as to migrate between the carrier structure and wafer. The positive pressure signal, when migrating from the blow-off hole, tends to expand toward the wafer periphery. Depending upon the adhesion characteristics of the wafer to the carrier structure, the migrating pressure signal could be omnidirectional, but could also radiate outwardly in one or more finger-like pathways.

As mentioned above, and as illustrated in the figures, once the pressure signal travels outwardly beyond the first suction ring region, it is free to encounter the centrally located inner ends of the channels 416 recessed in the bladder by deformation of the bladder into corresponding grooves 415 as shown in FIG. 13. It is expected that once having entered the inner ends of the channels 416, the pressure signal will preferentially travel along the channels toward the outer periphery of the wafer, owing to the enlarged reduced restriction pathway associated with the channels 426 and grooves 415. If desired, the grooves 415 and resulting channels 416 can extend inwardly of the first suction cup region, and could be made to extend immediately adjacent the blow-off hole 404. If multiple blow-off holes are provided, the grooves 415 and channels 416 could be made to extend to respective blow-off holes or could be networked together through groove connecting passageways extending between various grooves 415.

Although it is generally preferred that the wafer be acquired and retained on the carrier by resilient deflection of the bladder into the carrier spaces, the vacuum required to be applied to the wafer could be augmented or replaced by a vacuum signal applied to the blow-off hole although such has been found to be unnecessary.

In a preferred mode of operation, the grooves 415 extend to the outer periphery of the carrier, most preferably to a distance at or extending beyond the outer edge of the wafer. Accordingly, with this arrangement, additional relief for any vacuum between the wafer and carrier can also be obtained at the outer periphery of the wafer. It is expected that ambient pressure will enter channels 416 at the outer periphery of the wafer, traveling inwardly toward the wafer center. The associated pressure front traveling radially inwardly from the wafer periphery will meet a pressure front from pressure signals traveling outwardly from the blow-off hole, in order to more rapidly complete separation of the wafer from the carrier. It is believed helpful in this regard that the grooves 415 extend from approximately the center of the wafer to the wafer periphery, and it is generally preferred that multiple grooves 415 be provided over the carrier surface so as to distribute wafer ejecting activity in a more uniform manner, increasing control over the physical position of the wafer as it is released from the carrier.

It is possible to operate the carrier such that the ribs 411 pull the major surface of the bladder, so as to cause structures resembling annular depressions. However, it is generally preferred that such structures, even though they are of a type which would produce a suction cup effect, would impart relatively small deflections of the bladder such that any suction forces would be negligible compared to the inter-rib depressions illustrated in FIG. 15. Nonetheless, if it is desired to operate the carrier in a manner in which the ribs generate additional suction forces, the X–Y grooves would readily dissipate results in suction effects.

Although, the foregoing description sets forth preferred, exemplary embodiments and methods of operation of the inventions the scope of the invention is not limited to these specific embodiments or described methods of operation. Many details have been disclosed that are not necessary to practice the invention, but have been included to sufficiently disclose the best mode of operation and manner and process of making and using the invention. Modification may be made to the specific form and design of the invention without departing from its spirit and scope as expressed in the following claims.

What is claimed is:

1. An improved wafer carrier, for carrying a wafer having opposed active and rear surfaces, a central portion and an outer periphery, the carrier comprising:

a resilient bladder having opposed working and rear surfaces, a central portion and an outer periphery;

an internal support structure including a working face and an outer periphery which supports the resilient bladder, wherein the working face includes at least one groove recessed therein; and a pressure regulator configured to selectively supply negative and positive pressure to the rear surface of the resilient bladder wherein the resilient bladder deforms into the at least one groove of the internal support structure to create at least one channel recessed in the working surface of the resilient bladder extending from an inner portion of the resilient bladder to the outer periphery of the resilient bladder, when the pressure regulator supplies negative pressure to the rear surface of the bladder.

2. The wafer carrier of claim 1 wherein said at least one channel has first and second end portions adjacent the outer periphery of the resilient bladder and a central portion of the resilient bladder, respectively.

3. The wafer carrier of claim 1 wherein the resilient bladder has a circular shape and said at least one channel extends generally along a diameter of the circular shape.

4. The wafer carrier of claim 1 further comprising a second channel recessed in the working surface of the resilient bladder.

5. The wafer carrier of claim 4 wherein said second channel extends from the central portion to the outer periphery of the resilient bladder.

6. The wafer carrier of claim 4 wherein the resilient bladder has a circular shape and said at least one channel and said second channel extend generally along diameters of the circular shape.

7. The wafer carrier of claim 4 wherein said at least one channel and said second channel cross one another to form an x-shape recess in the working surface of the resilient bladder.

8. The wafer carrier of claim 1 wherein said at least one channel has a generally uniform cross-section throughout its length.

9. The wafer carrier of claim 1 wherein the at least one channel includes a annular portion and a radial portion.

* * * * *

UNITED STATES PATENT AND TRADEMARK OFFICE
CERTIFICATE OF CORRECTION

PATENT NO. : 6,746,318 B1
DATED : June 8, 2004
INVENTOR(S) : Mallery et al.

It is certified that error appears in the above-identified patent and that said Letters Patent is hereby corrected as shown below:

Column 13,
Line 36, delete "426" and insert -- 416 --.

Signed and Sealed this

Ninth Day of November, 2004

JON W. DUDAS
*Director of the United States Patent and Trademark Office*